United States Patent
Koziel

(10) Patent No.: US 6,734,698 B2
(45) Date of Patent: May 11, 2004

(54) RADIO FREQUENCY OSCILLATION DETECTOR

(75) Inventor: Reinhold Koziel, Muelheim A.D. Ruhr (DE)

(73) Assignee: Siemens Aktiengesellschaft, Munich (DE)

( * ) Notice: Subject to any disclaimer, the term of this patent is extended or adjusted under 35 U.S.C. 154(b) by 69 days.

(21) Appl. No.: 10/120,805

(22) Filed: Apr. 11, 2002

(65) Prior Publication Data

US 2003/0193325 A1 Oct. 16, 2003

(30) Foreign Application Priority Data

Oct. 12, 1999 (DE) .......................... 199 49 172

(51) Int. Cl.⁷ .......................... G01R 31/36; G01R 15/06
(52) U.S. Cl. .................... 324/771; 324/508; 324/520; 324/754; 439/824
(58) Field of Search .......................... 324/76.39, 508, 324/519, 520, 76.76, 536, 754, 771, 658; 439/824

(56) References Cited

U.S. PATENT DOCUMENTS

| 5,641,315 A | * | 6/1997 | Swart et al. .............. 439/824 |
| 6,285,538 B1 | * | 9/2001 | Krahn .......................... 361/87 |
| 6,362,709 B1 | * | 3/2002 | Paxman et al. ............ 333/245 |

FOREIGN PATENT DOCUMENTS

| DE | 257 904 A1 | * | 3/1995 |
| EP | 0 312 050 | * | 4/1989 |

* cited by examiner

*Primary Examiner*—N. Le
*Assistant Examiner*—Donald M Lair

(57) ABSTRACT

A Sensor for detecting radio-frequency oscillations of a voltage, and an arrangement of a sensor for detecting radio-frequency oscillations of the voltage in a line. The sensor (10) has a capacitor (15) whose first connection can be connected to the line (11). According to the invention, the second connection of the capacitor is associated with a current transformer (18) and a bush (19) for outputting a measured signal. The invention furthermore provides for a sensor (10) to be arranged in an intermediate space (13) between the line (11) and a shield (12).

12 Claims, 2 Drawing Sheets

RADIO FREQUENCY OSCILLATION DETECTOR

CROSS-REFERENCE TO RELATED APPLICATIONS

This application is the National Stage of International Application No. PCT/DE00/03318 and claims the benefit thereof. This application claims the benefit of Federal Republic of Germany Application No. 19949172.0, filed Oct. 12, 1999, both incorporated by reference herein in their entirety.

FIELD OF THE INVENTION

The present invention relates to a sensor for detecting radio-frequency oscillations of the voltage in a line, with the sensor having a capacitor whose first connection can be connected to the line. A sensor such as this is used for detecting radio-frequency voltage oscillations in power stations.

BACKGROUND OF THE INVENTION

Discharges and flash-overs can occur for various reasons in power stations. These lead to radio-frequency pulses, which are transmitted to one or more lines. In order to protect a power supply with high quality, these pulses must be detected and evaluated.

Sensors for detecting such oscillations are known, which have a capacitor whose first connection can be connected to the line. One or more resistors are associated with the second connection of this capacitor. The voltage drop across the resistor or resistors is measured, and is used to detect the radio-frequency oscillations. The known sensors have the disadvantage that a number of separate components are required. The space requirement for fitting these components is comparatively high. In addition, assembly is costly.

SUMMARY OF THE INVENTION

One object of the present invention is thus to provide a sensor which has fewer components, requires less space, and is easier to install.

According to the invention, this object is achieved for a sensor of the type mentioned initially in that a second connection of the capacitor is associated with a current transformer and a bush for outputting a measured signal.

The sensor according to the invention is smaller than the known sensors. It can be produced as a compact unit, and can thus easily be installed. In particular, there is no longer any need to install separate components successively, so that the installation process is considerably simplified and speeded up.

The second connection is advantageously also associated with a spark gap, which is connected in parallel with the current transformer. When unacceptably high loads occur, a short circuit occurs in the spark gap, and the current transformer is protected against being overloaded.

In one advantageous development, the second connection of the capacitor is grounded via the current transformer and the spark gap. The oscillations recorded by the capacitor are dissipated through the ground path, and only the measured signal is emitted.

According to one advantageous refinement, the sensor has an elastically mounted element for pressing against the line, and this element is connected to the first connection of the capacitor. The elastic mounting compensates for any manufacturing or installation tolerances.

According to one advantageous development, the element is spherical and is loaded by a compression spring. The use of a spherical element results in a defined contact area being provided between the element and the line. The compression spring that is used for contact pressure can be produced and installed easily, so that the production and installation costs are reduced.

The position of the element can advantageously be adjusted with respect to the sensor, in particular in the longitudinal direction of the sensor.

In consequence, the contact separation between the element and the line is adjustable, for matching to the respective application. In particular, a single sensor can be used for a number of different applications.

The invention furthermore relates to an arrangement of a sensor, in particular of a sensor as described above, on a line for detecting radio-frequency oscillations of the voltage, with the line being surrounded by a shield. According to the invention, the sensor is arranged in an intermediate space between the line and the shield. This arrangement requires only a small amount of space, is simple to install, and can be retrofitted to existing systems.

The sensor is advantageously attached to the shield. No additional components are required, so that the design and installation are simplified, and the cost is reduced.

In one advantageous refinement, the sensor has a bush for outputting a measured signal, and this bush is arranged outside the shield. Cables for tapping off the measured signal can be connected to the bush quickly and easily, and can be laid outside the shield.

According to one advantageous development, the sensor is arranged on a connecting plate which can be attached to the shield. The sensor can be installed on the connecting plate in advance, and the connecting plate is then attached to the shield. This speeds up the installation process.

The shield is advantageously provided with an insert for attachment of the sensor. This insert can be retrofitted to existing shields, so that the sensor according to the invention and the arrangement according to the invention can also be installed retrospectively in already existing systems.

According to one advantageous refinement, the shield is grounded. No special safety measures are then necessary in order to prevent contact with the shield. Furthermore, the grounding of the capacitor which is provided according to the invention can be produced via the shield. There is no need for any separate grounding cables.

Advantageous refinements and developments of the invention are described in the dependent claims.

BRIEF DESCRIPTION OF THE DRAWINGS

The invention will be described in more detail in the following text with reference to an exemplary embodiment which is illustrated schematically in the drawing, in which.

DESCRIPTION OF THE PREFERRED EMBODIMENT

Figure 1:
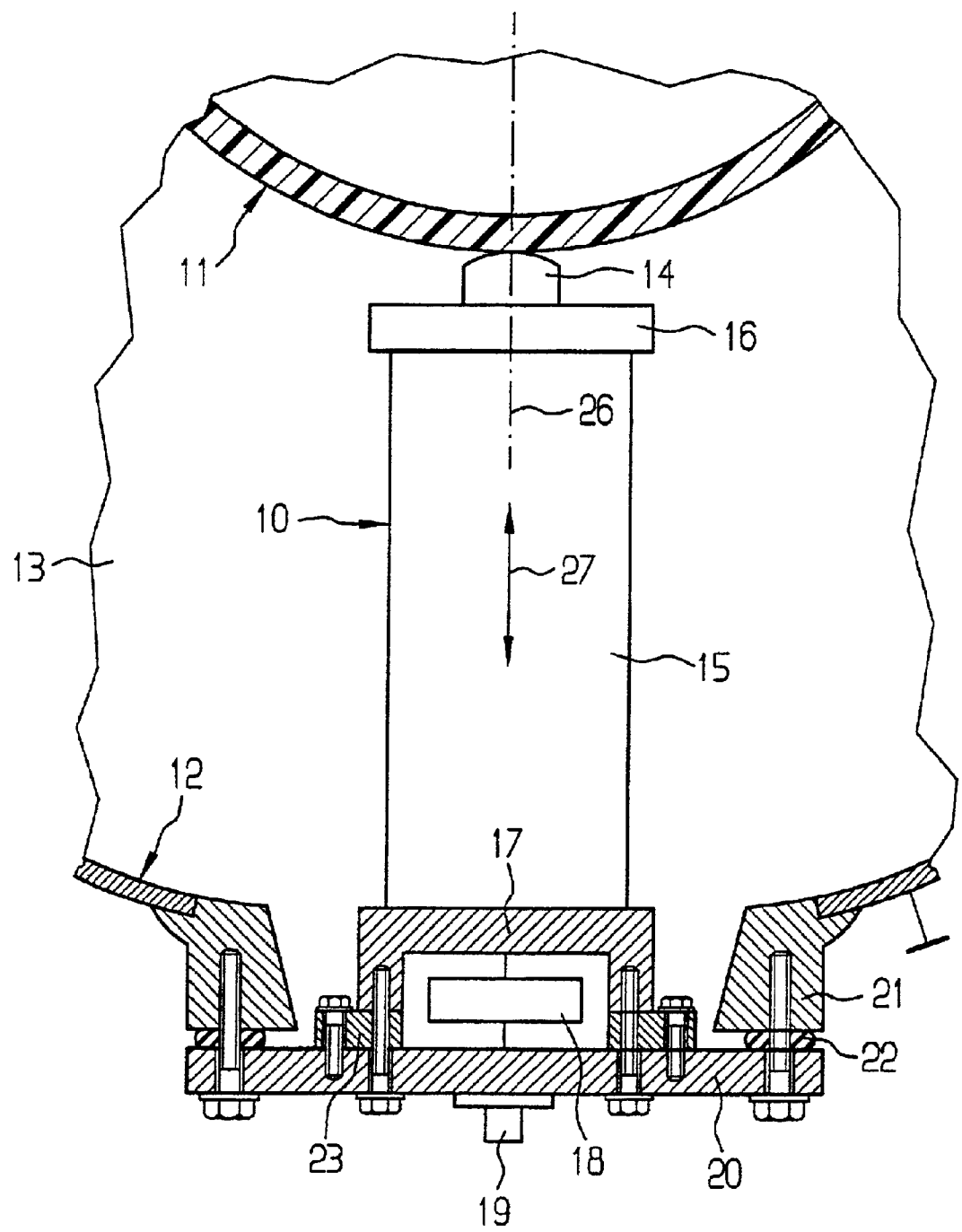
FIG. 1 shows a schematically illustrated arrangement of a sensor according to the invention.

FIG. 1 shows, schematically, a sensor 10 according to the invention, which is held in an intermediate space 13 between a live line 11 and a grounded shield 12. The sensor 10 has a contact point 14, a capacitor 15, which is held on both sides by plates 16, 17 composed of aluminum, a current transformer 18 and a bush 19. The bush 19 is arranged outside the shield 12.

The lower plate 17 is connected to a connecting plate 20 via an insulated intermediate plate 23. The intermediate plate 23 is used for isolation of the capacitor 15. Screws, which are illustrated schematically, are used for attachment.

The sensor 10 is attached to an insert 21 via the connecting plate 20. The insert 21 is connected to the shield 12 in a manner which is not illustrated in any more detail, for example via a welded joint. It is once again attached by means of schematically illustrated screws. One or more seals 22 is or are arranged between the connecting plate 20 and the insert 21, for shielding and for oscillation damping.

The contact point 14 is adjustable as shown by the arrow 27 in the direction of a longitudinal axis 26 of the sensor 10. This makes it possible to adjust the contact separation between the contact point 14 and the line 11.

The sensor 10 is held completely in the intermediate space 13. The bush 19 is accessible from outside the shield 12, so that only a small amount of effort is required to lay further cables. Furthermore, the entire sensor 10 has a compact construction and can be completely installed in advance, together with the connecting plate 20. The insert 21 can be retrofitted in already existing shields 12, so that the sensor 10 according to the invention can also be fitted retrospectively, with only a small amount of effort.

Figure 2:
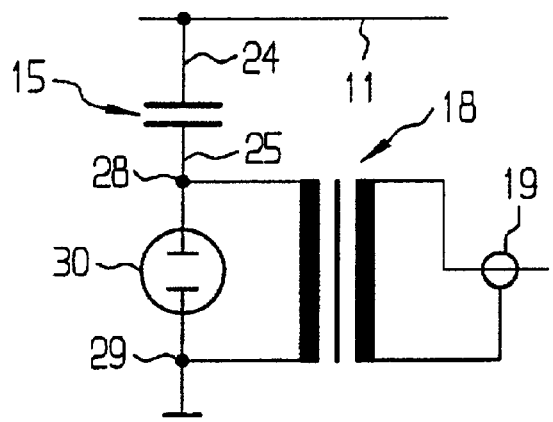
FIG. 2 shows a schematic illustration of the circuit on which the sensor is based.

FIG. 2 shows a schematic illustration of the circuit that is used. The capacitor 15 of the sensor 10 is connected to the line 11 via a first connection 24. The connection is made via the contact point 14. The second connection 25 of the capacitor 15 is associated with the current transformer 18 as well as the bush 19 and a spark gap 30. The spark gap 30 is connected in parallel with the current transformer 18, between its connections 28, 29. Grounding is provided downstream from the connection 29. Voltage oscillations which are detected in the line 11 produce a signal which is emitted to the bush 19 via the capacitor 15 and the current transformer 18. The signal can be tapped off at the bush 19, and can be supplied to an evaluation unit, which is not illustrated in any more detail. If unacceptably high loads occur, a short circuit occurs in the spark gap 30. This reliably prevents damage to the current transformer 18.

Figure 3:
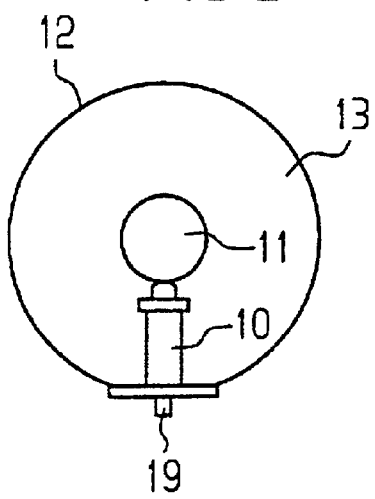
FIG. 3 shows a complete schematic illustration of the arrangement according to the invention.

FIG. 3 shows a schematic overall illustration of the arrangement of the sensor 10 according to the invention. The sensor 10 is held entirely in the intermediate space 13. Only the insert 21 as well as the connecting plate 20 and the bush 19 project outward beyond the shield 12. The space which is additionally required for fitting the sensor 10 is thus minimal.

Figure 4:
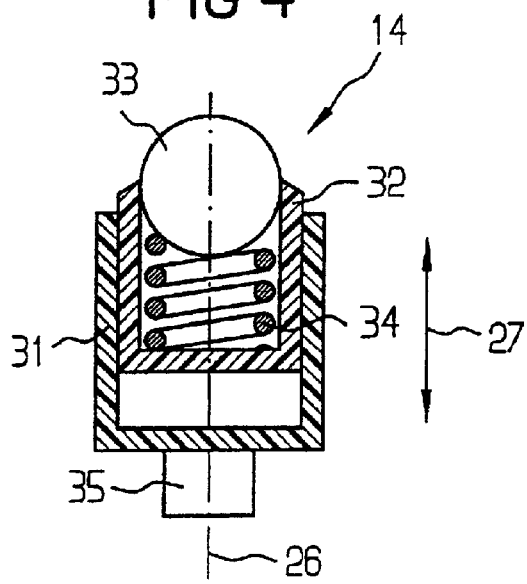
FIG. 4 shows an enlarged illustration of a contact point of the sensor.

FIG. 4 shows the contact point 14 of the sensor 10 enlarged. The contact point 14 has an outer housing 31, in which an inner housing 32 is held. The outer housing 31 and the inner housing 32 are connected to one another via a thread, which is not illustrated in any more detail. Adjustment can thus be carried out, as shown by the arrow 27, along the longitudinal axis 26 of the sensor 10 by rotating the inner housing 32 with respect to the outer housing 31.

A sphere 33 is arranged in the inner housing 32, and is loaded by a compression spring 34. When installed, the sphere 33 makes contact with the line 11, and is connected via a connection 35 to the first connection 24 of the capacitor 15. Any voltage oscillations which occur in the line 11 are absorbed by the sphere 33, and are passed on to the capacitor 15 via the connections 35, 24, and from the capacitor 15 via the current transformer 18 to the bush 19. The adjustment capability in the direction of the longitudinal axis 26 as shown by the arrow 27 allows the contact separation to be adjusted. The use of the sphere 33 avoids local damage to the line 11 and enlargement of the contact surface area between the line 11 and the sphere 33. This ensures an essentially constant contact surface area over lengthy time periods.

The capacitance of the capacitor 15 as well as the configuration of the current transformer 18 and of the spark gap 30 depend on the individual situation. However, the capacitance of the capacitor 15 can normally be chosen to be less than in existing sensors. If, for example, a voltage of 30 kV is applied to the line 11 then, according to the invention, a capacitance of only 10 nF is now required, in comparison to 100 nF in the past. In this case, the spark gap 30 is designed for 400 V.

The sensor 10 according to the invention has a compact construction, and can be installed quickly and easily. There is no longer any need to fit separate components. The arrangement according to the invention considerably reduces the space required for fitting the sensor 10. Furthermore, it can be retrofitted into already existing systems, with minimal effort.

What is claimed is:

1. A power station sensing system adapted to detect a power supply in the power station comprising:
   a sensor adapted to detect radio frequency oscillations of a voltage in a line; and
   a capacitor operatively associated with the sensor having a first connection and a second connection,
   the first connection being connected to a contact point which contacts the line, the contact point being arranged such that can be adjusted in a controlled manner in the direction of a longitudinal axis of the sensor, and having an elastically mounted element for pressing against the line,
   the second connection having an associated bush for outputting a measured signal and an associated current transformer.

2. A power station sensing system as claimed in claim 1, wherein the second connection is associated with a spark gap, which is connected in parallel with the current transformer.

3. A power station sensing system as claimed in claim 2, wherein the second connection is grounded via the current transformer and the spark gap.

4. A power station sensing system as claimed in claim 3, wherein the contact point has a contact portion in the shape of a sphere that contacts the line by way of the elastic element.

5. A power station sensing system as claimed in claim 3 wherein the elastic element being a spring means.

6. A power station sensing system as claimed in claim 5 wherein the sensor defines a longitudinal axis and the contact point can be adjusted in a longitudinal direction of the sensor.

7. The Sensor as claimed in claim 1 wherein the line is surrounded by a shield, with the shield and the line defining an intermediate space and the capacitor of the sensor is arranged in the intermediate.

8. A power station sensing system as claimed in claim 7, wherein the shield further having an insert portion for attachment of the sensor there through.

9. A power station sensing system as claimed in claim 8, wherein the sensor is arranged on a connecting plate being attached to the insert portion.

10. A power station sensing system as claimed in claim 9 wherein the bush for outputting a measured signal from the sensor is accessible from outside the shield through the insert portion.

11. A power station sensing system as claimed in claim 10 wherein the shield is grounded.

12. An arrangement of a power station sensing system, comprising:
- a sensor on a line for detecting radio-frequency oscillations of the voltage, the line being surrounded by a shield, wherein the sensor is arranged in an intermediate space between the line and the shield and the sensor comprising:
  - a capacitor having a first connection and a second connection,
    - the first connection being connected to a contact point which contacts the line, the contact point being arranged such that can be adjusted in a controlled manner in the direction of a longitudinal axis of the sensor, and having an elastically mounted element for pressing against the line,
    - the second connection having an bush for outputting a measured signal and an current transformer.

* * * * *